US008699888B2

(12) United States Patent
Scaffardi et al.

(10) Patent No.: US 8,699,888 B2
(45) Date of Patent: Apr. 15, 2014

(54) OPTICAL LINEAR FEEDBACK CIRCUIT (75) Inventors: Mirco Scaffardi, Parma (IT); Gianluca Berrettini, Gragnano (IT); Antonella Bogoni, Mantova (IT)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 342 days.

(21) Appl. No.: 13/041,968

(22) Filed: Mar. 7, 2011

(65) Prior Publication Data

US 2012/0219290 A1 Aug. 30, 2012

(30) Foreign Application Priority Data

Feb. 24, 2011 (EP) ..................................... 11155851

(51) Int. Cl.
*H04B 10/299* (2013.01)
*G02F 3/00* (2006.01)

(52) U.S. Cl.
USPC .......................................... 398/175; 359/108

(58) Field of Classification Search
USPC .................. 398/173, 175; 359/108
See application file for complete search history.

(56) References Cited

U.S. PATENT DOCUMENTS

| 4,815,804 | A | | 3/1989 | Desurvire et al. |
| 4,856,862 | A | | 8/1989 | Passmore et al. |
| 4,900,115 | A | * | 2/1990 | Heuring et al. ............... 359/108 |
| 5,155,779 | A | * | 10/1992 | Avramopoulos et al. ........ 385/24 |
| 5,208,705 | A | * | 5/1993 | Avramopoulos et al. ..... 398/154 |
| 5,537,243 | A | * | 7/1996 | Fatehi et al. ................ 359/341.1 |
| 5,566,261 | A | | 10/1996 | Hall et al. |
| 6,952,172 | B1 | * | 10/2005 | Bhardwaj et al. ................ 341/13 |
| 2005/0219066 | A1 | * | 10/2005 | Bhardwaj et al. ................ 341/13 |
| 2009/0273821 | A1 | * | 11/2009 | Kang ............................ 359/108 |

OTHER PUBLICATIONS

European Search Report, dated Apr. 28, 2011 in corresponding European Application No. 11155851.6-1225.
T.J. Soukup et al., Implementation of a fiber-optic delay-line memory, 2219 Applied Optics, vol. 31, No. 17, Jun. 10, 1992, New York, US, pp. 3233-3240.
V.P.Heuring, Systems considerations in designing and implementing a bit serial optical computer, 2417 Optical Engineering, vol. 30, No. 12, Dec. 1991, pp. 1931-1935.
G. Barbarossa et al., Novel architecture for optical guided-wave recirculating delay lines, Advances in Optical Information Processing V, SPIE vol. 1704, XP008031638, 1992, pp. 138-144.
T. Houbavlis et al.; All-Optical Signal Processing and Applications Within the Esprit Project DO__ALL, Journal of Lightwave Technology, vol. 23, No. 2, Feb. 2005, pp. 781-801.

* cited by examiner

*Primary Examiner* — Nathan Curs
(74) *Attorney, Agent, or Firm* — Nixon & Vanderhye P.C.

(57) ABSTRACT

An optical linear feedback circuit has an optical loop delay path (10) for recirculating a sequence of optical signals, and an output path for outputting delayed optical signals after circulating one or more times around the loop. A selector (50) is provided for selecting one or more of the delayed optical signals from the sequence, and an optical logic circuit (20) is coupled to carry out a logical operation on the selected delayed optical signals to create an optical feedback signal which is coupled to the optical loop delay path, so that the optical feedback signal can be added to the sequence of optical signals already circulating. By recirculating around a loop, each round trip can be regarded as equivalent to a shift of a shift register, so longer sequences can be built up without needing an additional storage cell for each shift function.

18 Claims, 7 Drawing Sheets

FIG 8 input

10001 (a) 2.5mW/div 1ns/div

10011 (b) 2.5mW/div 1ns/div output

100010000111110 (c) 200µW/div 1ns/div

10011000100001 (d) 200µW/div 1ns/div

FIG 9

OPTICAL LINEAR FEEDBACK CIRCUIT

CROSS REFERENCE TO RELATED APPLICATION

The disclosure of Europe Patent Application No. 11155851.6, filed on Feb. 24, 2011, is incorporated herein by reference.

TECHNICAL FIELD

This invention relates to optical linear feedback circuits, to nodes having such circuits, and to corresponding methods of operating such circuits.

BACKGROUND

Memory elements are key components of all the electronic central processing units (CPU) as for example shift registers within the arithmetic logic units to perform operations as multiplication and division. CPUs are connected with random access memory (RAM) slots to store and read data to be processed. Telecom applications require memory elements as well. Buffers within the network nodes store information when a contention occurs at an output port. Shift registers are employed for serial to parallel conversion and cyclic operations. Error detection and correction techniques such as parity check, or cyclic redundancy check can be implemented with shift registers. Linear feedback shift registers (LFSR) enable encryption/decryption within secure communication systems. They are also employed for scrambling data streams to be transmitted, and for pseudo-random bit sequence (PRBS) generators. The possibility to implement these important functionalities in the optical domain could improve the performance of future optical networks. In fact they could allow storing of information without converting the data into the electronic domain, thus avoiding the speed limitations typical of electronics. Another issue of the present network nodes is the huge amount of power consumption, complexity and footprint. The chance to operate signal processing into the optical domain, included storing information, could help to reduce the power consumption, complexity and footprint if integrated solutions can be adopted. Optical elementary logic gates, complex digital logic functions and their applications within an all-optical packet switching node are already demonstrated. Despite optical computing still being some way from commercial use, the demonstration of optical logic circuits and optical memory elements with discrete components represents a first step. For practical implementations integrated solutions are desirable to reduce productions costs. It is known from U.S. Pat. No. 6,952,172 to provide an optical PRBS generator using optical delays, an optical feedback path and an optical XNOR gate. It is also known to provide an all optical linear feedback shift register using a non recirculating shift register, as shown in T. Houbavlis, K. E. Zoiros, M. Kalyvas, G. Theophilopoulos, C. Bintjas, K. Yiannopoulos, N. Pleros, K. Viachos, H. Avramopoulos, L,. Schares, L. Occhi, G. Guekos, J. R. Taylor, S. Hansmann, W. Miller, "All-Optical Signal Processing and Applications Within the Esprit Project DO_ALL", IEEE J. Lightwave Technol., vol. 23, n.2, pp. 781-801, February 2005. This uses an optical regenerative memory so the optical pulses are sent once round a loop, and then are regenerated at the UNI device.

SUMMARY

An object of the invention is to provide improved apparatus or methods.

According to a first aspect, the invention provides:

An optical linear feedback circuit having an optical loop delay path for recirculating a sequence of optical signals. One or more output paths are coupled to the optical loop delay path, for outputting delayed optical signals of the sequence after circulating one or more times around the optical loop delay path. A selector is provided for selecting one or more of the delayed optical signals from the sequence, and an optical logic circuit is coupled to the one or more output paths for carrying out a logical operation on the selected delayed optical signals. A feedback path feeds an optical feedback signal output by the optical logic circuit to the optical loop delay path, and an optical coupler is provided to couple the feedback path to the optical loop delay path, so that in operation the optical feedback signal can be added to the sequence of optical signals already circulating.

Such circuits may have the benefit over multi stage optical shift registers that by recirculating around a loop delay path, each round trip can be regarded as equivalent to a shift of a shift register, so longer sequences can be built up without needing an additional storage cell for each shift function. Hence less hardware is needed, or longer sequences can be generated for a given amount of hardware. Compared to the prior art based around the UNI device which regenerates the optical signals to recirculate the information using new optical signals without recirculating the old optical signals, there is a benefit of simpler construction since there is no need for such a specialised non linear device needing polarisation maintaining fiber for optical switching to provide regeneration. Hence design and manufacturing is likely to be easier and cheaper, as such specialised parts cannot be integrated readily.

Another aspect of the invention provides a method of operating an optical linear feedback circuit, by circulating a sequence of optical signals in an optical loop delay path, outputting delayed optical signals of the sequence after circulating one or more times around the loop delay path, and selecting one or more of the delayed optical signals from the sequence. A logical operation is carried out on the selected delayed optical signals, and an optical feedback signal resulting from the logical operation is coupled to the loop delay path, to add the optical feedback signal to the sequence of optical signals already circulating.

Any additional features can be added to these aspects, or disclaimed from them, and some are described in more detail below. Any of the additional features can be combined together and combined with any of the aspects. Other effects and consequences will be apparent to those skilled in the art, especially over compared to other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

DEFINITIONS

Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps.

References to nodes can encompass any kind of switching node, not limited to the types described, not limited to any level of integration, or size or bandwidth or bit rate and so on.

References to optical signals are intended to encompass any kind of optical signal, modulated with information in any format.

ABBREVIATIONS

CPU Central Processing Unit
RAM Random Access Memory
LFSR Linear Feedback Shift Register
PRBS Pseudo Random Bit Sequence
OLFSR Optical Linear Feedback Shift Register
UNI Ultrafast Nonlinear Interferometer
NRZ Non Return-to-Zero
SOA Semiconductor Optical Amplifier
ASE Amplified Spontaneous Emission
BPF Band Pass Filter
EDFA Erbium Doped Fibre Amplifier
FWM Four Wave Mixing
HNLF Highly Nonlinear Fibre
ODL Optical Delay Line
MZI Mach-Zehnder Interferometer
PPLN Periodic Poled Lithium Niobate

INTRODUCTION

Figure 1:
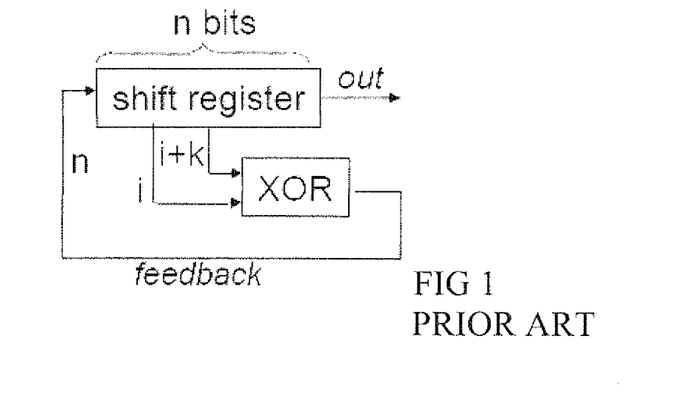
FIG. 1 shows a schematic view of a conventional LFSR.

By way of introduction to the embodiments, some issues with conventional designs will be explained.
FIG. 1, Linear Feedback Shift Register FIG. 1 shows a schematic view of a two-taps linear feedback shift register. The shift register is the basic element to realize a linear feedback shift register (LFSR) found in many essential components of communications systems such as PRBS generators, convolutional encoders, scramblers and randomizers. In FIG. 1 the LFSR scheme has an XOR gate to operate on two tapped bits i and i+k from within the shift register. The result bit is fed back to the input of the shift register at position (n) and the sequence in the register is then 1-bit shifted and the tapped bits change.

Figure 2:
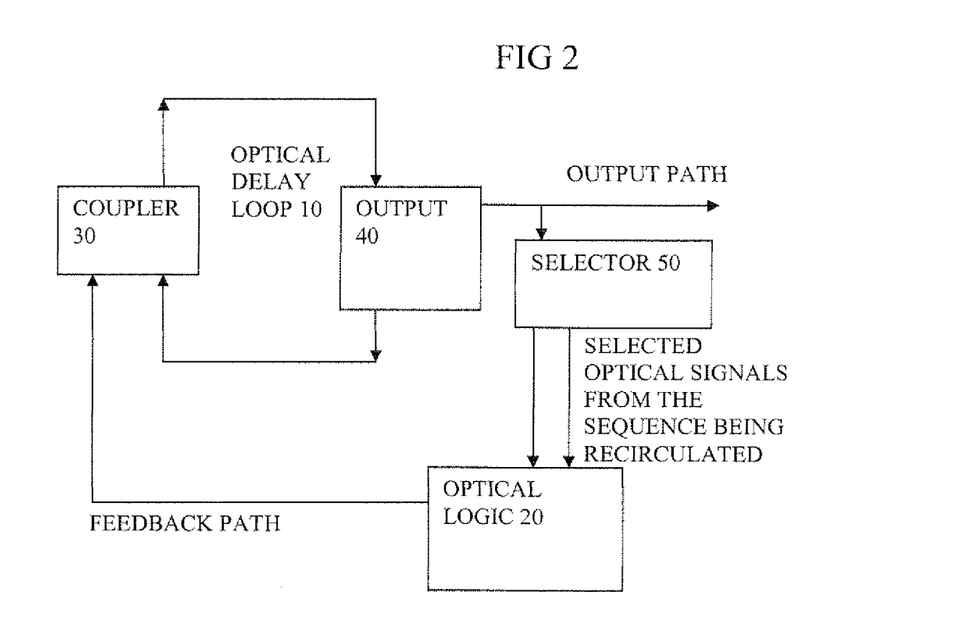
FIG. 2 shows a schematic view of a circuit according to a first embodiment.
Figure 3:
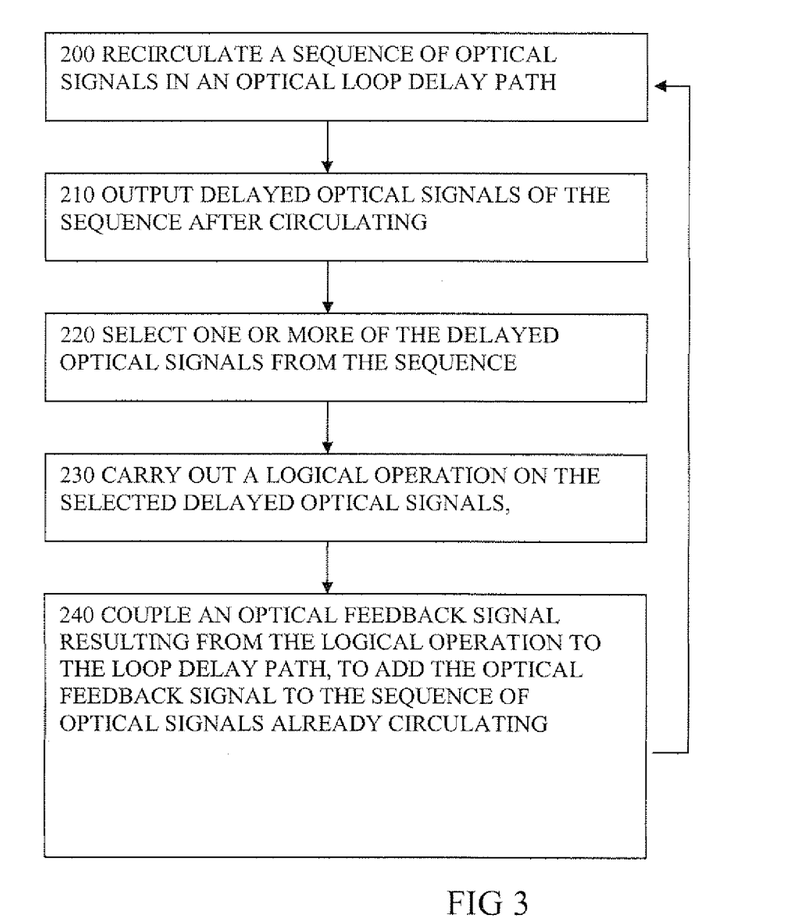
FIG. 3 shows method steps in operation of a circuit according to an embodiment, FIGS. 4 to 6 to circuits according to further embodiments.

The embodiments described in more detail are concerned with implementing such a feedback circuit as an optical linear feedback shift register (OLFSR). The OLFSR proposed here employs a single-loop based optical shift register where two bits are tapped with an external circuit. The two tapped bits interact into a XOR to generate the new bit which, in turn, is fed into the shift register in the input position.
FIGS. 2,3 A First Embodiment, FIG. 2 shows a schematic view of a first embodiment having an optical delay loop, a coupler 30 for coupling an optical feedback path into the loop and an output part 40 for coupling an output path from the loop. A selector 50 is provided for selecting some bits of the sequence of optical signals being recirculated around the optical delay loop. The selected optical signals are fed to optical logic 20, and the resulting output is fed back to the coupler 30. The delays inherent in the optical delay loop and the feedback path are arranged so that the coupler has the effect of adding the feedback signals from the feedback path to the sequence being recirculated, to create a longer sequence. This can be repeated many times, each time the relative delays in the feedback path and the optical delay loop being adjusted according to the new length of the sequence. In principle the feedback signals can be added to the front or the back of the sequence.

The number of times that the signals can be recirculated may be limited in practice by noise building up in the loop or by a build up of differences in power levels of the parts of the sequence. Nevertheless, a useful number of recirculations can be achieved without providing new regenerated optical pulses, and thus the benefit of reduced complexity can be obtained since there is no need for multiple cascaded optical delay loops and no need for regeneration.

An example of steps in the operation of the circuit according to an embodiment is shown in FIG. 3. At step 200 a sequence of optical signals is recirculated in an optical loop delay path. At step 210 some of the signals are output from the loop, delayed by the loop. At step 220, one or more of the delayed signals are selected. At step 230 a logical operation is carried out in the optical domain on the selected signals. At step 240, an optical feedback signal resulting from the logical operation is coupled into the loop delay path, timed so as to be added to the sequence of signals already circulating. The steps can be repeated to lengthen the sequence. In principle, the repeat can happen after one recirculation or after multiple recirculations. Typically the optical signals are binary logic, but they can be coded in other ways such as multilevel logic or pulse width modulated signals and so on.
Some Additional Features Embodiments can have any additional features, some such features are discussed below.

The optical loop delay path can have an optical amplifier for amplifying the sequence of optical signals each time they recirculate around the loop, to compensate for optical power losses around the loop. This can enable the optical signal quality to be maintained and controlled.

The feedback path and the optical loop delay path can be arranged so that the optical feedback signal has the same polarization as the sequence of optical signals already circulating. This can help reduce polarization sensitivity and maintain the same optical power level for the different pulses, to enable longer sequences to be built up which is useful for various applications.

The circuit can have a start sequence inserter, for inserting a start sequence of optical signals into the optical loop delay path. This can be equivalent to loading a shift register, and in principle it can be located anywhere in the loop or in the feedback path.

The optical loop delay path can have an optical reset arrangement for clearing the recirculating optical signals by suppressing the amplification. This is effectively like clearing a shift register, to enable restart. This helps clear any noise which has built up in the optical delay loop.

The selector being arranged to receive optical clock signals synchronised with the sequence of delayed optical signals, and to select according to the optical clock signals. This is one way of having more of the operation in the optical domain. This enables less use of high speed electronics and can enable greater integration.

The circuit can have a variable delay for delaying the optical clock signals to adjust the selection according to an extension of the sequence caused by coupling the feedback signal into the optical loop delay path. Again this can help increase the amount of control to be implemented in the optical domain.

The optical logic can comprise an XOR gate. This is particularly useful for implementing a random number generator, useable in many applications. The circuit can be incorporated in an optical scrambler. This can be incorporated in a node of a telecommunications network for various applications.

The circuit can be used as an optical pseudo random bit sequence generator, which has various applications in a node of a telecommunications network.

The method can have the step of amplifying optically the sequence of optical signals as they recirculate around the loop.

The method can have the step of controlling the polarization of the feedback optical signal.

The method can have the step of inserting a start sequence of optical signals into the optical loop delay path.

The method can have the step of clearing the recirculating optical signals after a number of recirculations.

The method can have the step of receiving optical clock signals synchronised with the sequence of delayed optical signals, and making the selection according to the optical clock signals.

The method can have the step of delaying the optical clock signals to adjust the selection according to an extension of the sequence caused by coupling the feedback signal into the optical loop delay path.

These various steps have benefits and effects corresponding to those of the circuit features mentioned above.

Figure 4:
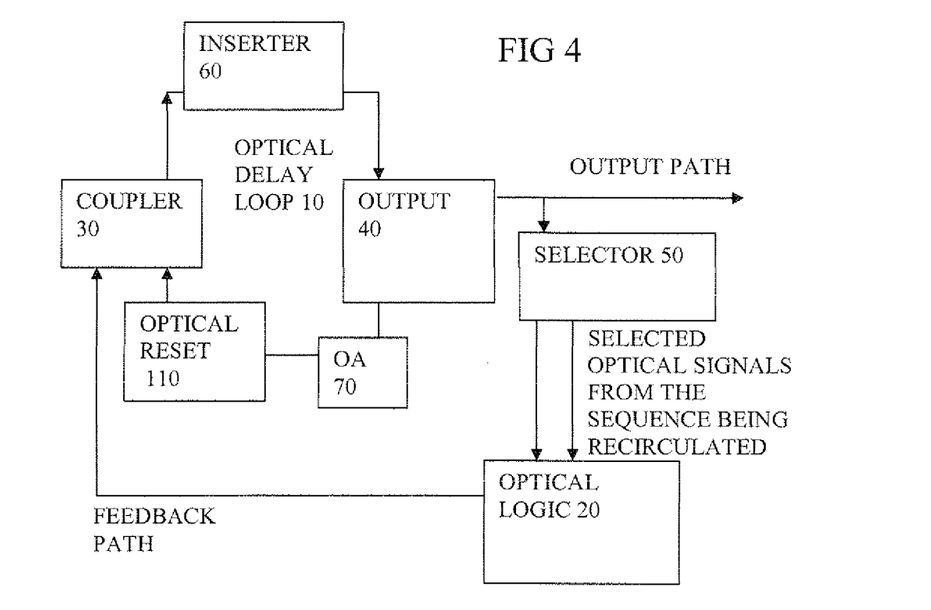
Figure 5:
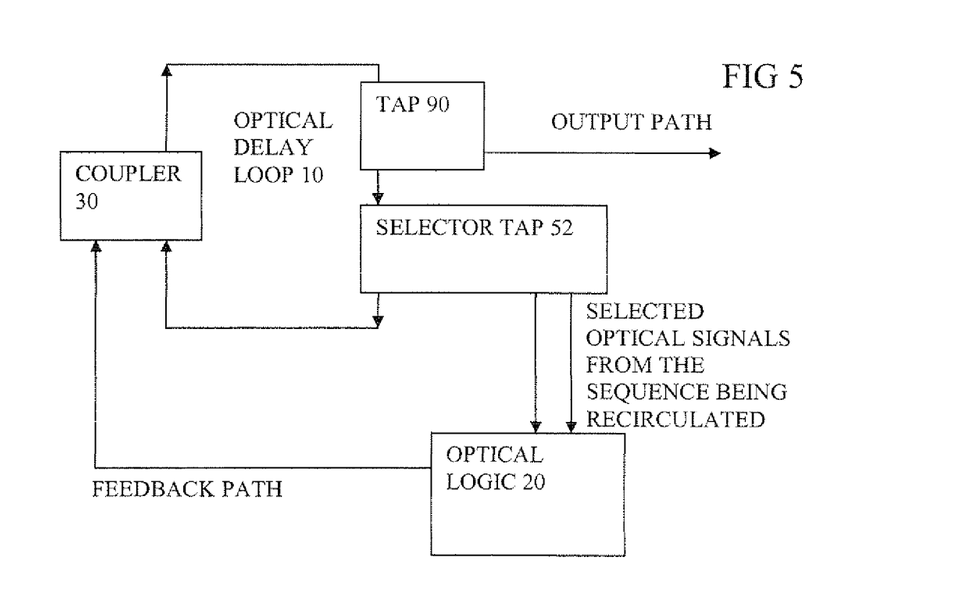
Figure 6:
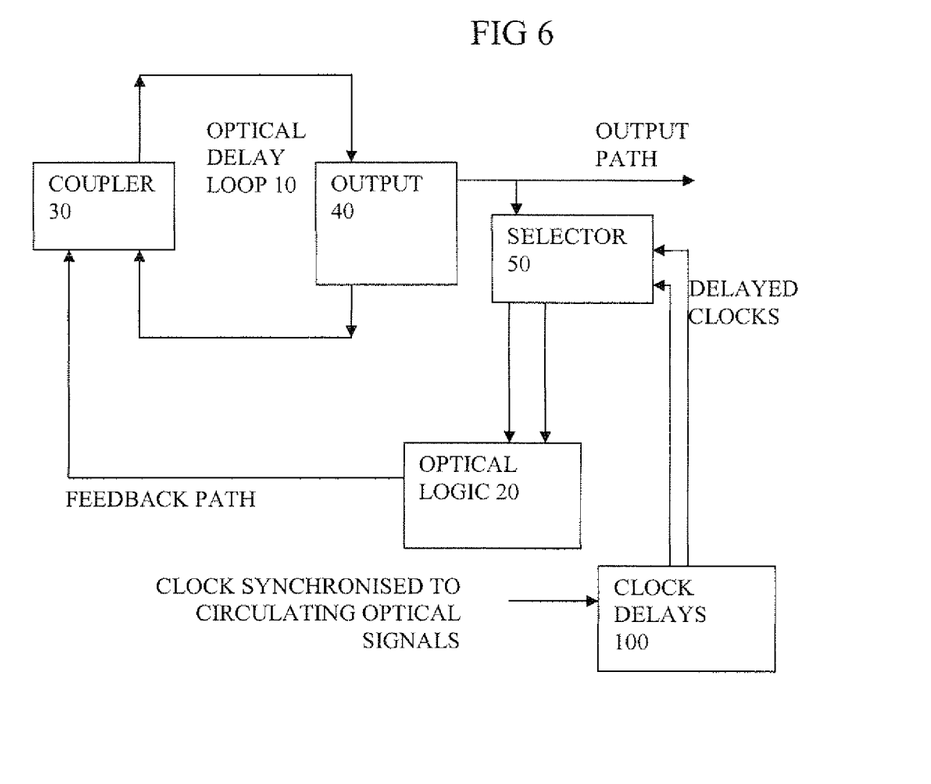

FIGS. 4 to 6, Further Embodiments

FIG. 4 shows a similar embodiment to that of FIG. 2. In this case the optical loop has an optical amplifier 70, and an optical reset device 110. They are shown after the optical coupling 40 of the output path, but in principle they can be located elsewhere in the optical delay loop, and can be implemented in various ways. There is also an inserter device 60 for inserting an initial sequence of optical signals. This can be implemented in various ways and can in principle be located elsewhere in the loop or in the feedback path.

FIG. 5 shows an embodiment similar to that of FIG. 2, except that the coupling for the output from the delay loop is implemented in two parts, a tap 90 for the output path and the selector tap 52. This means the optical signals selected for the feedback path are selected from the loop separately, rather than from the output path. In principle the selector tap can be implemented as a splitter, while the tap 90 could be implemented as an optical switch to switch all the optical power out of the loop after the optical sequence has been extended to the desired length.

FIG. 6 shows an embodiment similar to that of FIG. 2, except that the selector is arranged to receive optical clocks to control the timing of the selection of the right parts of the sequence of optical signals. Two clocks are shown, and can be delayed, to select different bits or parts of the sequence, using a clock delay part 100, based on a signal synchronised to the circulating optical signals, such as a start of the sequence. The delays can be increased by this part for each successive increase in the length of the sequence, so that the optical feedback signals still have the correct timing relative to the sequence in the loop, so that they are added to the correct place at the start or end of the sequence.

Figure 7:
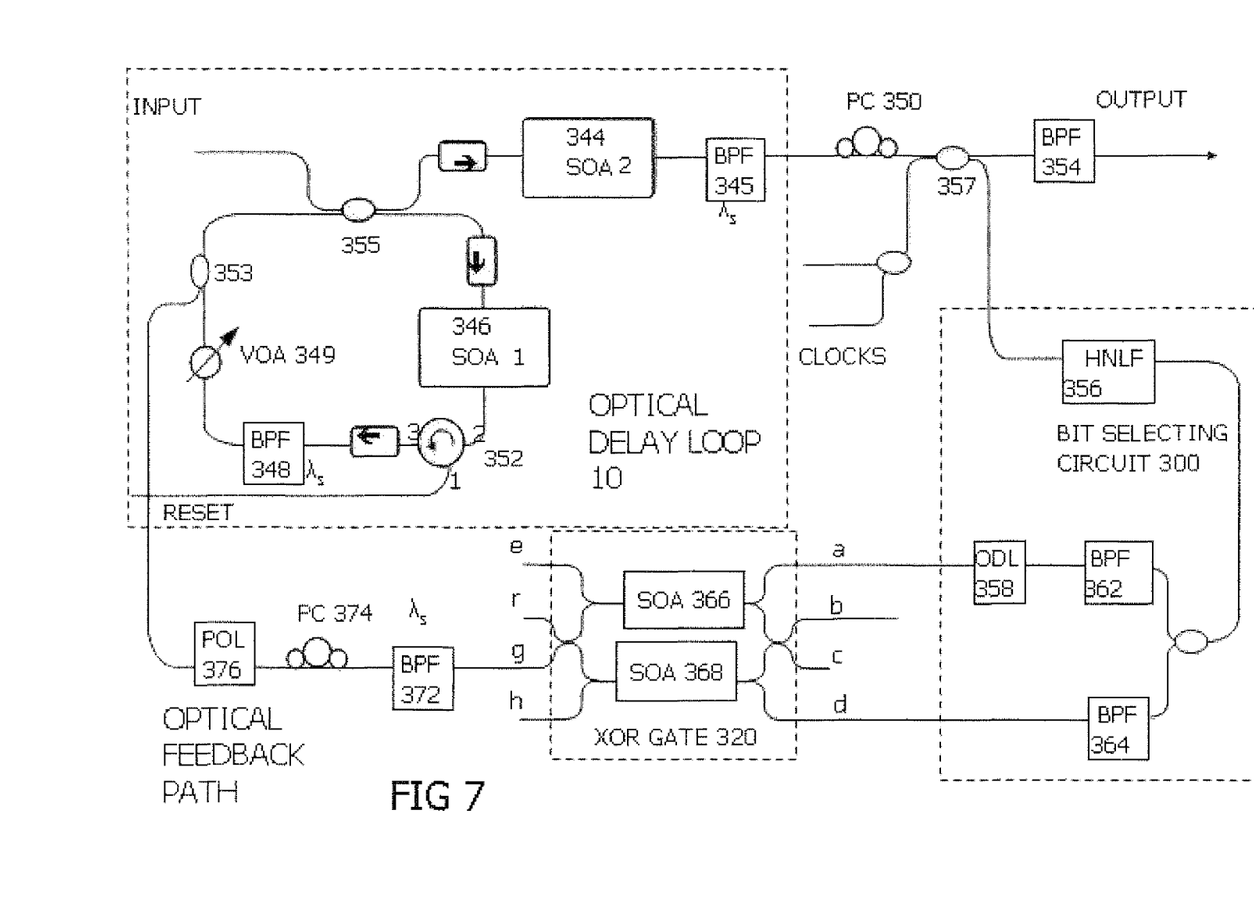
FIG. 7 shows a circuit according to a demonstration example.

FIG. 7, Demonstration Example

An example embodiment for demonstrating an all-optical LFSR is shown in FIG. 7. The main components of the scheme are an optical buffer in the form of delay loop 10, with a feedback coupler 353, a bit selecting circuit 300, and a XOR gate 320. The XOR gate is implemented in a conventional way using two semiconductor optical amplifiers SOA 366 and 368 in parallel, and having is terminals a to h and a number of couplers to connect these to the four inputs and outputs of the amplifiers.

The optical delay loop also has a 3 dB coupler 355 for fetching the sequence, an SOA 346 for compensating the loss of the loop, and a reset arrangement in the form of a circulator 352 to put in a counter-propagating pump signal that clears the loop every cycle. There are also two isolators for preventing the backward propagation that can cause instability, one located before the SOA, and the other located after the circulator. There is also a 0.6 nm BPF 348 for ASE noise eliminating, a spool of standard fiber for providing the delay for synchronization, and another 3 dB coupler 353 for feeding back the new bit to the circulating packet. A VOA 349 is also provided for better regulation of power level, in conjunction with the control of the gain of the SOA.

The wavelength for the data signal at the input as well as the probe input b of the XOR gate $\lambda s$ is 1559.2 nm, for the buffer erasing pump $\lambda p$ is 1546.9 nm, and for the bit selecting clocks $\lambda 1$ and $\lambda 2$ are 1553.9 nm and 1552 nm respectively. The data vector is generated by modulating the CW $\lambda s$ with a 10 Gbps NRZ electrical pattern whose period is TP=33.3168 µs in which only 5 bits are used as the initial sequence for the shift register. Before entering the optical buffer, the extinction ratio of the modulated optical data of the optical feedback signal can be improved for example by an acousto-optic modulator and if needed, its polarization can be properly adjusted by a polarization controller. When the circuitry is implemented in the form of an integrated optical circuit, the feedback path and the optical loop delay path can be designed so that the optical feedback signal has the same polarization as the sequence of optical signals already circulating, to avoid the need for a polarization controller. The gain of the inside SOA is properly controlled to prevent lasing in the cavity. The travelling time of the packet in the buffer is designed to be TL=1.85 µs, meaning that up to 18 round trips can be accommodated by the pattern's period TP but one of those should be preserved for erasing the buffer before it is fetched a new sequence. At first, the initial sequence enters the buffer as well as propagates directly to the bit selecting circuit, afterward, for every round trip, a new sequence as a replica of the previous one plus the feedback bit comes out. At the last round trip, a pump signal inserted into the buffer through the is circulator will strongly reduce the gain of the SOA. Both the circulating packet and the accumulating in-band ASE noise will be suppressed, thus the buffer is completely cleaned for a new cycle. After going out on the output path from the buffer, the packet is amplified by a linear SOA 344, and optionally with an EDFA (not shown) in cascade to gain more power. A band pass filter 345 and polarization controller 350 are shown for cleaning up the signal after amplification. Every round trip, after the new bit is added to the circulating packet or other sequence, the first and the last bits of the 1-bit shifted sequence (or other bits as desired) are selected for the XOR operation.

Referring to the corresponding LFSR in FIG. 1, for the implemented OLFSR, the variables were set so that: i=1 and k=4, n=5. With this setup, the bit selecting circuit requires 2 clock signals coupled into the output path by coupler 357 for optically sampling the proper bits from the incoming sequence, These clocks are excluded from the output by band pass filter 354. In the bit selecting circuit 300, this sampling process is done by exploiting FWM between the clocks and the sequence of optical signals in a 250 m-long HNLF 356. Since at every round trip the sequence must be 1-bit shifted, the sampling clocks input to the coupler 357 can be delayed accordingly for 1 bit, resulting the clock period of TC=TL TB where TB=100 ps is the bit time. Moreover, the clocks also have to be synchronized with the data pattern and should be refreshed after a cycle; hence they are programmed as a TP-period sequence of TC-spaced bits.

Before entering the XOR gate, the two FWM outputs are filtered by properly adjusting the two BPFs 362 and 364 and their relative delay is aligned by precisely tuning the ODL 358.

The employed XOR gate can be implemented by a commercial integrated SOA Mach-Zehnder interferometer (SOA-MZI). The outputs of the bit selecting circuit are fed as pump signals to ports a and d of the SOA-MZI. They are synchronized with a clock used as the probe signal at port b. This probe signal has the same characteristic of the two clocks used for bit selecting except that its wavelength is the data one $\lambda$s. The control currents for the two SOAs and the phase shifters on the two arms are properly adjusted in order to maximize the XOR output extinction ratio. The output of the XOR gate is then amplified and fed back into the buffer via band pass filter 372, polarization controller 374 and polarizer 376. Some elements such as the polarization control may not be needed in an integrated optics implementation. The feedback bit should be precisely allocated at the end of the packet circulating inside the buffer, meaning that the feedback time—the time for the packet going out of the buffer, being sampled, generating the FWM idles, operating the XOR gate and finally come back to the buffer—should be TF=TL+TB+Tseq in which Tseq is the original sequence duration and equal to 500 ps in this setup.

Figure 8:
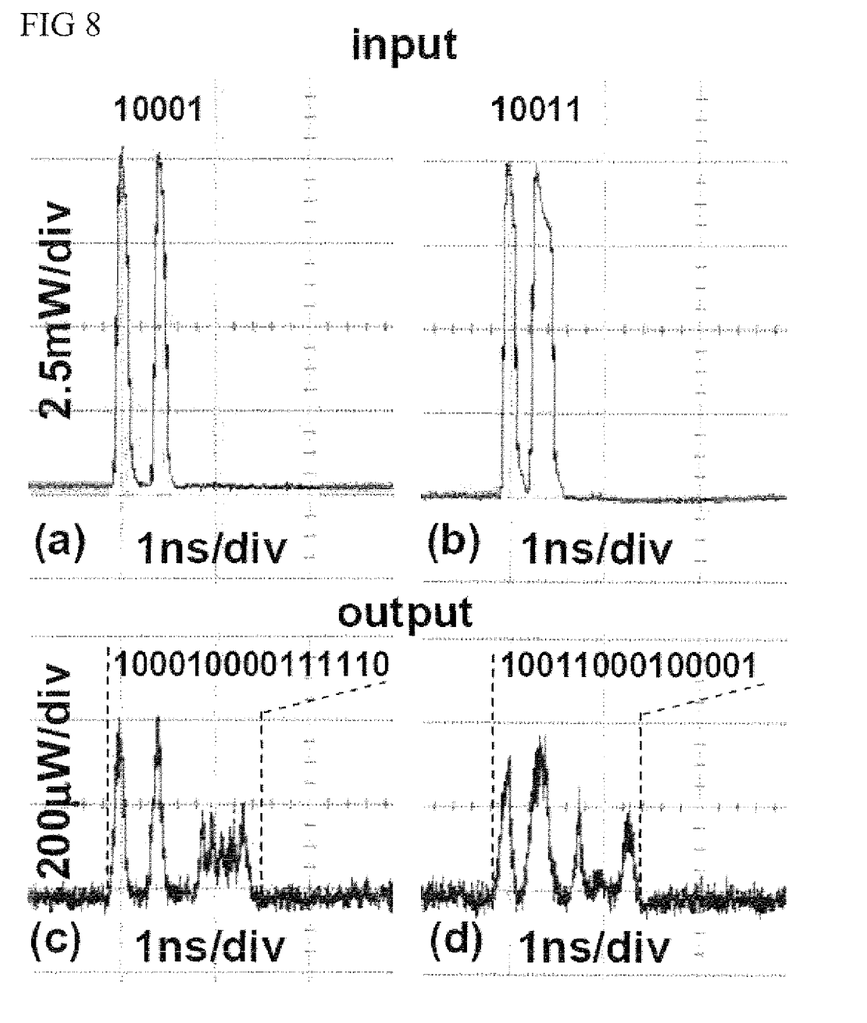
FIGS. 8a-8d show graphs of input and output optical signals.

FIGS. 8 *a*) to *d*) shows graphs of input (a), (b) and corresponding output sequences (c), (d) after 10 round trips for two different starting sequences (16-time average). It depicts the results at the 10th round trip for two different input initial sequences (10001) and (10011) taken at the output point in FIG. 7. The output sequence results have 15 bits. The equalization between bits in the sequence and the quality of the pulses is strongly limited by the accumulating ASE noise inside the buffer, the long fiber-based structure and the bit's polarization. As the packet circulates in the buffer, the added in-band ASE noise increases every round trip, reducing the extinction ratio and the efficiency of all the processes afterward. The fiber-based setup also can cause misalignment between the clocks, spoil the essential synchronism and degrade the performance of the FWM and the XOR operation. One possible solution for reducing all of these problems and hence improving the performance is the integration approach. The bit selection could be implemented exploiting nonlinear effects into an SOA or a periodic-poled lithium niobate (PPLN) instead of using a long HLNF, as shown by A. Bogoni, X. Wu, Z. Bakhtiari, S. Nuccio, A. E. Willner, "640 Gb/s All-Optical Logic Functions in a PPLN Waveguide", in Proc ECOC'10, Mo.1.A.5, September 2010. Moreover the extinction ratio of the pulses at the SOA-MZI XOR output (<13.5 dB) could be improved, e.g. with a saturable absorber at its output, thus increasing the number of allowed round trips into the shift register and reducing the noise on the final bit sequence.

Figure 9:
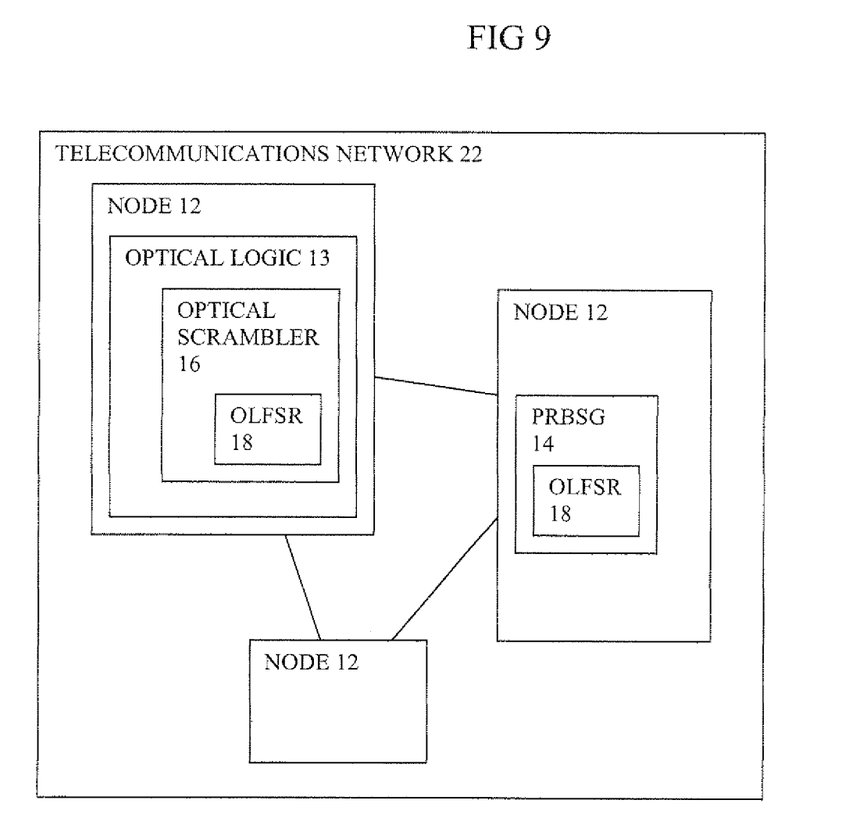
FIG. 9 shows a network view.

FIG. 9, Network View

FIG. 9 shows a schematic view of a telecommunications network 22 having a number of nodes 12. Optical logic including at least an optical scrambler 16 using an OLFSR circuit 18 is provided in at least one of the nodes. Optical logic including at least a PRBS generator 14 using an OLFSR is provided in at least one of the nodes. The OLFSR can be implemented according to any of the embodiments described above for example. The optical logic can have various functions in the nodes, and can be applied to optical computers or optical signal processors without being part of a telecommunications network.

CONCLUDING REMARKS

Various embodiments of an optical LFSR exploiting a loop memory element as basic block have been described. There can be a gain element in the loop such as an SOA. Starting from a sequence of 5 bits at 10 Gb/s an output sequence of 15 bits is obtained, i.e. 10 round trips are performed. The proposed scheme of LFSR enables implementation directly in the optical domain of functionalities such as encryption/decryption within secure communication systems, scrambling of data streams to be transmitted and pseudo-random bit sequence generation for coding or other purposes.

Other variations and embodiments can be envisaged within the claims.

The invention claimed is:

1. An optical linear feedback circuit having:
   an optical loop delay path for recirculating a sequence of optical signals,
   one or more output paths coupled to the optical loop delay path, for outputting delayed optical signals of the sequence after circulating one or more times around the optical loop delay path,
   a selector for selecting one or more of the delayed optical signals from the sequence,
   an optical logic circuit coupled to the one or more output paths for carrying out a logical operation on the selected delayed optical signals,
   a feedback path for feeding an optical feedback signal output by the optical logic circuit to the optical loop delay path, and
   an optical coupler to couple the feedback path to the optical loop delay path, so that in operation the optical feedback signal can be added to the sequence of optical signals already circulating,
   wherein the optical loop delay path and the feedback path are separate and different paths.

2. The circuit of claim 1, the optical loop delay path having an optical amplifier for amplifying the sequence of optical signals each time they recirculate around the loop, to compensate for optical power losses around the loop.

3. The circuit of claim 1, the feedback path and the optical loop delay path being arranged so that the optical feedback signal has the same polarization as the sequence of optical signals already circulating.

4. The circuit of claim 1, having a start sequence inserter, for inserting a start sequence of optical signals into the optical loop delay path.

5. The circuit of claim 2, the optical loop delay path having an optical reset arrangement for clearing the recirculating optical signals by suppressing the amplification.

6. The circuit of claim 1, the selector being arranged to receive optical clock signals synchronised with the sequence of delayed optical signals, and the selector being operable to select according to the optical clock signals.

7. The circuit of claim 6, the selector having a variable delay for delaying the optical clock signals to adjust the selection according to an extension of the sequence caused by coupling the feedback signal into the optical loop delay path.

8. The circuit of claim 1, the optical logic comprising an XOR gate.

9. The circuit of claim 1, wherein the delayed optical signals of the sequence are configured to be output after circulating multiple times around the optical loop delay path.

10. A node of a telecommunications network having an optical scrambler having an optical linear feedback circuit having:
    an optical loop delay path for recirculating a sequence of optical signals,
    one or more output paths coupled to the optical loop delay path, for outputting delayed optical signals of the sequence after circulating one or more times around the optical loop delay path,
    a selector for selecting one or more of the delayed optical signals from the sequence,
    an optical logic circuit coupled to the one or more output paths for carrying out a logical operation on the selected delayed optical signals,
    a feedback path for feeding an optical feedback signal output by the optical logic circuit to the optical loop delay path, and
    an optical coupler to couple the feedback path to the optical loop delay path, so that in operation the optical feedback signal can be added to the sequence of optical signals already circulating,
    wherein the optical loop delay path and the feedback path are separate and different paths.

11. A node of a telecommunications network having an optical pseudo random bit sequence generator having an optical linear feedback circuit having:
    an optical loop delay path for recirculating a sequence of optical signals,
    one or more output paths coupled to the optical loop delay path, for outputting delayed optical signals of the sequence after circulating one or more times around the optical loop delay path,
    a selector for selecting one or more of the delayed optical signals from the sequence,
    an optical logic circuit coupled to the one or more output paths for carrying out a logical operation on the selected delayed optical signals,
    a feedback path for feeding an optical feedback signal output by the optical logic circuit to the optical loop delay path, and
    an optical coupler to couple the feedback path to the optical loop delay path, so that in operation the optical feedback signal can be added to the sequence of optical signals already circulating,
    wherein the optical loop delay path and the feedback path are separate and different paths.

12. A method of operating an optical linear feedback circuit, having the steps of:
    circulating a sequence of optical signals in an optical loop delay path,
    outputting delayed optical signals of the sequence after circulating one or more times around the loop delay path,
    selecting one or more of the delayed optical signals from the sequence,
    carrying out a logical operation on the selected delayed optical signals, and
    coupling an optical feedback signal resulting from the logical operation to the loop delay path, to append the optical feedback signal to the sequence of optical signals already circulating,
    wherein the optical loop delay path and the feedback path are separate and different paths.

13. The method of claim 12, having the step of amplifying optically the sequence of optical signals as they recirculate around the loop.

14. The method of claim 12, having the step of controlling the polarization of the feedback optical signal.

15. The method of claim 12, having the step of inserting a start sequence of optical signals into the optical loop delay path.

16. The method of claim 12 having the step of clearing the recirculating optical signals after a number of recirculations.

17. The method of claim 12 having the step of receiving optical clock signals synchronised with the sequence of delayed optical signals, and making the selection according to the optical clock signals.

18. The method of claim 12, the selector having a variable delay for delaying the optical clock signals to adjust the selection according to an extension of the sequence caused by coupling the feedback signal into the optical loop delay path.

* * * * *

UNITED STATES PATENT AND TRADEMARK OFFICE
CERTIFICATE OF CORRECTION

| | | |
|---|---|---|
| PATENT NO. | : 8,699,888 B2 | Page 1 of 1 |
| APPLICATION NO. | : 13/041968 | |
| DATED | : April 15, 2014 | |
| INVENTOR(S) | : Scaffardi et al. | |

It is certified that error appears in the above-identified patent and that said Letters Patent is hereby corrected as shown below:

In the Specification

In Column 2, Line 67, delete "FIGS. 4 to 6 to" and insert -- FIGS. 4 to 6 show --, therefor.

In Column 6, Line 23, after "having", delete "is".

In Column 6, Line 65, after "through the", delete "is".

In Column 7, Line 16, delete "sequence," and insert -- sequence. --, therefor.

In Column 7, Line 22, delete "TC=TL TB" and insert -- TC=TL + TB --, therefor.

Signed and Sealed this
Eleventh Day of November, 2014

Michelle K. Lee
*Deputy Director of the United States Patent and Trademark Office*